United States Patent
Eliyahu et al.

(10) Patent No.: US 6,614,692 B2
(45) Date of Patent: Sep. 2, 2003

(54) EEPROM ARRAY AND METHOD FOR OPERATION THEREOF

(75) Inventors: Ron Eliyahu, Herzelia (IL); Eduardo Maayan, Kfar Saba (IL); Ilan Bloom, Haifa (IL); Boaz Eitan, Ra'anana (IL)

(73) Assignee: Saifun Semiconductors Ltd., Netanya (IL)

( * ) Notice: Subject to any disclaimer, the term of this patent is extended or adjusted under 35 U.S.C. 154(b) by 0 days.

(21) Appl. No.: 09/761,818

(22) Filed: Jan. 18, 2001

(65) Prior Publication Data

US 2002/0132436 A1 Sep. 19, 2002

(51) Int. Cl.[7] ............................................. G11C 16/04
(52) U.S. Cl. ............................ 365/185.29; 365/185.17; 365/185.18; 365/185.28
(58) Field of Search .................. 365/185.29, 185.17, 365/185.18, 185.28, 185.01

(56) References Cited

U.S. PATENT DOCUMENTS

| | | |
|---|---|---|
| 3,895,360 A | 7/1975 | Cricchi et al. |
| 4,016,588 A | 4/1977 | Ohya et al. |
| 4,017,888 A | 4/1977 | Christie et al. |
| 4,151,021 A | 4/1979 | McElroy |
| 4,173,766 A | 11/1979 | Hayes |
| 4,173,791 A | 11/1979 | Bell |
| 4,281,397 A | 7/1981 | Neal et al. |
| 4,306,353 A | 12/1981 | Jacobs et al. |
| 4,342,149 A | 8/1982 | Jacobs et al. |
| 4,360,900 A | 11/1982 | Bate |
| 4,380,057 A | 4/1983 | Kotecha et al. |
| 4,388,705 A | 6/1983 | Sheppard |
| 4,389,705 A | 6/1983 | Sheppard |
| 4,471,373 A | 9/1984 | Shimizu et al. |
| 4,527,257 A | 7/1985 | Cricchi |
| 4,586,163 A | 4/1986 | Koike |
| 4,630,085 A | 12/1986 | Koyama |
| 4,667,217 A | 5/1987 | Janning |
| 4,780,424 A | 10/1988 | Holler et al. |

(List continued on next page.)

FOREIGN PATENT DOCUMENTS

| | | |
|---|---|---|
| EP | 0693781 | 7/1994 |
| EP | 0751560 | 6/1995 |
| EP | 1073120 | 7/2000 |
| GB | 2157489 | 3/1984 |
| JP | 04291962 | 3/1991 |
| JP | 05021758 | 7/1991 |
| JP | 04226071 | 8/1992 |
| JP | 07193151 | 12/1993 |
| JP | 09162314 | 12/1995 |
| WO | WO 96/15553 | 11/1994 |
| WO | WO 99/31670 | 12/1997 |

OTHER PUBLICATIONS

U.S. patent application Ser. No. 09/082,280, Eitan, filed May 20, 1998.

(List continued on next page.)

Primary Examiner—Hoai V. Ho
(74) Attorney, Agent, or Firm—Eitan, Pearl, Latzer & Cohen-Zedek, LLP.

(57) ABSTRACT

A method for operating an electrically erasable programmable read only memory (EEPROM) array includes providing an array including a multiplicity of memory cells, wherein each memory cell is connected to a word line and to two bit lines, selecting one of the memory cells, and erasing a bit of thief selected memory cell while applying an inhibit word line voltage to a gate of an unselected memory cell. An EEPROM array is also described, the array including a multiplicity of NROM memory cells, wherein each memory cell is connected to a word line and to two bit lines, and wherein each NROM cell is individually erasable and individually programmable without significantly disturbing unselected cells.

23 Claims, 4 Drawing Sheets

U.S. PATENT DOCUMENTS

| | | |
|---|---|---|
| 4,847,808 A | 7/1989 | Kobatake |
| 4,870,470 A | 9/1989 | Bass, Jr. et al. |
| 4,916,671 A | 4/1990 | Ichiguchi |
| 4,941,028 A | 7/1990 | Chen et al. |
| 5,021,999 A | 6/1991 | Kohda et al. |
| 5,075,245 A | 12/1991 | Woo et al. |
| 5,117,389 A | 5/1992 | Yiu |
| 5,168,334 A | 12/1992 | Mitchell et al. |
| 5,172,338 A | 12/1992 | Mehrotra et al. |
| 5,175,120 A | 12/1992 | Lee |
| 5,204,835 A | 4/1993 | Eitan |
| 5,214,303 A | 5/1993 | Aoki |
| 5,241,497 A | 8/1993 | Komarek |
| 5,260,593 A | 11/1993 | Lee |
| 5,268,861 A | 12/1993 | Hotta |
| 5,289,412 A | 2/1994 | Frary et al. |
| 5,293,563 A | 3/1994 | Ohta |
| 5,305,262 A | 4/1994 | Yoneda |
| 5,311,049 A | 5/1994 | Tsuruta |
| 5,315,541 A | 5/1994 | Harari et al. |
| 5,345,425 A | 9/1994 | Shikatani |
| 5,349,221 A | 9/1994 | Shimoji |
| 5,350,710 A | 9/1994 | Hong et al. |
| 5,359,554 A | 10/1994 | Odake et al. |
| 5,393,701 A | 2/1995 | Ko et al. |
| 5,394,355 A | 2/1995 | Uramoto et al. |
| 5,399,891 A | 3/1995 | Yiu et al. |
| 5,412,601 A | 5/1995 | Sawada et al. |
| 5,414,693 A | 5/1995 | Ma et al. |
| 5,418,176 A | 5/1995 | Yang et al. |
| 5,418,743 A | 5/1995 | Tomioka et al. |
| 5,422,844 A | 6/1995 | Wolstenholme et al. |
| 5,424,978 A | 6/1995 | Wada et al. |
| 5,426,605 A | 6/1995 | Van Berkel et al. |
| 5,434,825 A | 7/1995 | Harari |
| 5,450,341 A | 9/1995 | Sawada et al. |
| 5,450,354 A | 9/1995 | Sawada et al. |
| 5,467,308 A | 11/1995 | Chang et al. |
| 5,477,499 A | 12/1995 | Van Buskirk et al. |
| 5,495,440 A | 2/1996 | Asakura |
| 5,496,753 A | 3/1996 | Sakurai et al. |
| 5,521,870 A | 5/1996 | Ishikawa |
| 5,523,251 A | 6/1996 | Hong |
| 5,553,018 A | 9/1996 | Wang et al. |
| 5,583,808 A | 12/1996 | Brahmbhatt |
| 5,599,727 A | 2/1997 | Hakozaki et al. |
| 5,623,438 A | 4/1997 | Guritz et al. |
| 5,654,568 A | 8/1997 | Nakao |
| 5,656,513 A | 8/1997 | Wang et al. |
| 5,661,060 A | 8/1997 | Gill et al. |
| 5,683,925 A | 11/1997 | Irani et al. |
| 5,712,814 A | 1/1998 | Fratin et al. |
| 5,726,946 A | 3/1998 | Yamagata et al. |
| 5,751,037 A | 5/1998 | Aozasa et al. |
| 5,754,475 A | 5/1998 | Bill et al. |
| 5,768,192 A * | 6/1998 | Eitan .......................... 365/182 |
| 5,777,919 A | 7/1998 | Chi-Yung et al. |
| 5,787,036 A | 7/1998 | Okazawa |
| 5,793,079 A | 8/1998 | Georgescu et al. |
| 5,834,851 A | 11/1998 | Ikeda et al. |
| 5,836,772 A | 11/1998 | Chang et al. |
| 5,841,700 A | 11/1998 | Chang |
| 5,847,441 A | 12/1998 | Cutter et al. |
| 5,862,076 A | 1/1999 | Eitan |
| 5,864,164 A | 1/1999 | Wen |
| 5,870,335 A | 2/1999 | Khan et al. |
| 5,946,558 A | 8/1999 | Hsu |
| 5,949,728 A | 9/1999 | Liu et al. |
| 5,963,412 A | 10/1999 | En |
| 5,963,465 A | 10/1999 | Eitan |
| 5,966,603 A | 10/1999 | Eitan |
| 5,973,373 A | 10/1999 | Krautschneider et al. |
| 5,990,526 A | 11/1999 | Bez et al. |
| 5,991,202 A | 11/1999 | Derhacobian et al. |
| 5,999,444 A * | 12/1999 | Fujiwara et al. ....... 365/185.02 |
| 6,011,725 A * | 1/2000 | Eitan ......................... 365/131 |
| 6,018,186 A | 1/2000 | Hsu |
| 6,020,241 A | 2/2000 | You et al. |
| 6,028,324 A | 2/2000 | Su et al. |
| 6,030,871 A | 2/2000 | Eitan |
| 6,034,403 A | 3/2000 | Wu |
| 6,063,666 A | 5/2000 | Chang et al. |
| 6,081,456 A * | 6/2000 | Dadashev .............. 365/185.23 |
| 6,128,226 A | 10/2000 | Eitan et al. |
| 6,134,156 A | 10/2000 | Eitan |
| 6,137,718 A | 10/2000 | Reisinger |
| 6,147,904 A * | 11/2000 | Liron .................... 365/185.03 |
| 6,163,048 A * | 12/2000 | Hirose et al. ............... 257/315 |
| 6,218,695 B1 * | 4/2001 | Nachumovsky ............ 257/296 |
| 6,222,768 B1 * | 4/2001 | Hollmer et al. ........ 365/185.16 |
| 6,256,231 B1 | 7/2001 | Lavi et al. |

OTHER PUBLICATIONS

U.S. patent application Ser. No. 09/348,720, Eitan, filed Jul. 6, 1999.

U.S. patent application Ser. No. 09/413,408, Eitan, filed Oct. 6, 1999.

U.S. patent application Ser. No. 09/536,125, Eitan, filed Mar. 28, 2000.

Ricco, Bruno, "Nonvolatile Multilevel Memories for Digital Application," *IEEE,* vol. 86, No. 12, pp. 2399–2421, issued 1998.

"2 Bit/Cell EEPROM Cell Using Band–To–Band Tunneling For Data Read–Out," *IBM Technical Disclosure Bulletin,* U.S. IBM Corp. NY vol. 35, No. 4B, ISSN:0018–8689, Sep. 1992.

Hsing–Huang Tsent et al. "Thin CVD Gate Dielectric for ULSI Technology", *IEEE,* 0–7803–1450–6, 1993.

Pickar, K.A., "Ion Implantation in Silicon," *Applied Solid State Science,* vol. 5, R. Wolfe Edition, Academic Press, New York, 1975.

Bhattacharyya et al., "FET Gate Structure for Nonvolatile N–Channel Read–Mostly Device," *IBM Technical Disclosure Bulletin,* U.S. IBM Corp. vol. 18, No. 6, pp. 1768, 1976.

U.S. patent application Ser. No. 08/902,890, Eitan.

U.S. patent application Ser. No. 08/905,286, Eitan.

* cited by examiner

EEPROM ARRAY AND METHOD FOR OPERATION THEREOF

FIELD OF THE INVENTION

The present invention relates generally to electrically erasable, programmable read only memory (EEPROM) arrays and methods for operation thereof, and more particularly, to nitride read only memory (NROM) EEPROM arrays and inhibiting disturbs in such arrays.

BACKGROUND OF THE INVENTION

EEPROM arrays are utilized for storage of data Typically, the data stored therein can be changed, either by programming or erasing, multiple times over the lifetime of the array. As in all non-volatile memory arrays, each cell is individually programmed; however, in contrast to either erasable, programmable read only memory (EPROM) or FLASH arrays, in EEPROM arrays each cell can also be individually erased.

Typical memory uses a single bit per cell, wherein electrical charge is stored on the floating gate of each cell. Within each cell, two possible voltage levels exist. The levels are controlled by the amount of charge that is stored on the floating gate; if the amount of charge on the floating gate is above a certain reference level, the cell is considered to be in a different level. Accordingly, each cell is characterized by a specific threshold voltage ($V_t$. Programing the cell increases threshold voltage $V_t$, whereas erasing the cell decreases threshold voltage $V_t$.

Non-volatile memory arrays comprise rows and columns of memory cells connected to word lines (rows of the array) and bit lines (columns). Each memory cell is connected to one word line and at least one bit line. Another terminal of the memory cell is connected either to another bit line (in which case, one of the bit lines is called the drain line and the other is the source line), or to a common line, such as a common source ground, depending on the array architecture. Programing or erasing an individual cell requires application of certain voltages to the word line and bit lines.

Generally when programming or erasing a cell, one or more of the neighboring cells may also be affected by the programming/erasing operation, causing thereto a possible change in their threshold voltage. This unwanted change in threshold voltage of unselected cells is known in the art as the disturb problem, herein a "disturb". A similar effect also occurs during a read operation. However, due to the relative weakness of the applied voltage levels, the effect is significantly smaller.

A standard prior art solution to the disturb problem in EEPROM arrays is to use two transistors per memory bit of the array, i.e., in addition to the memory transistor, a select transistor is also incorporated per cell. The select transistor usually disconnects the drain of the unselected memory transistors from the drain voltages used in the programming/erasing operations. The use of a select transistor per cell, however, significantly increases the area of the memory array.

SUMMARY OF THE INVENTION

The present invention seeks to solve the abovementioned disturb problem. In the present invention, an unselected memory cell that can experience a possible drop in threshold voltage is inhibited from being erased by application of an inhibit word line voltage to the gate of the unselected cell.

The term "inhibiting" as used throughout the specification and claims refers to reducing, minimizing or even eliminating the disturb effect.

The magnitude of the gate voltage is selected such that the difference between the drain or source and gate voltages applied to the unselected cell is sufficiently small so that the threshold voltage of the unselected cell does not drop below a predetermined value. By application of the inhibit voltage, it is possible to achieve negligible erasure of the unselected cell, even during relatively long erasure times and multitudes of selected cell accesses.

In a virtual ground array, the application of a relatively high voltage to the word line of a selected cell being programmed may cause a voltage propagation along unselected bit lines, thereby tuning on the cells along the unselected bit lines. In accordance with a preferred embodiment of the present invention, the voltage propagation is blocked by isolation zones positioned alongside bit lines. The isolation zones may be positioned so as to isolate a single column of memory cells or a slice of a plurality of columns.

In accordance with a preferred embodiment of the present invention the EEPROM array comprises nitride read only memory (NROM) cells. Each NROM cell is individually erasable and individually programmable without significantly disturbing unselected cells, by using inhibit voltages as described hereinbelow.

There is thus provided in accordance with a preferred embodiment of the present invention, a method for operating an electrically erasable programmable read only memory (EEPROM) array, the method including providing an array including a multiplicity of memory cells, wherein each memory cell is connected to a word line and to two bit lines, one of the bit lines serving as a source and the other bit line serving as a drain, selecting one of the memory cells, and erasing a bit of the selected memory cell, while applying an inhibit word line voltage to a gate of an unselected memory cell.

In accordance with a preferred embodiment of the present invention the memory cells are non-floating gate memory cells.

Further in accordance with a preferred embodiment of the present invention the memory cells are nitride read only memory (NROM) cells. The NROM cells may be single bit, or alternatively, they may have more than one bit.

Still further in accordance with a preferred embodiment of the present invention the array is a virtual ground array.

The unselected memory cell may or may not share the same bit line as the selected cell, In accordance with a preferred embodiment of the present invention the inhibit gate voltage is of such magnitude that a threshold voltage of the unselected memory cell is lowered not more than a predetermined amount.

Further in accordance with a preferred embodiment of the present invention the erasing includes applying to the selected memory cell a negative gate voltage, a positive drain voltage and a floating source voltage.

Still further, in accordance with a preferred embodiment of the present invention, at least one column of the memory cells is placed between a pair of isolation zones, the isolation zones defining therebetween a slice of word lines and bit lines.

There is also provided in accordance with a preferred embodiment of the present invention a method for operating an EEPROM array, the method including providing an array including a multiplicity of NROM cells, wherein each memory cell is connected to a word line and to two bit lines, one of the bit lines serving as a source and the other bit line serving as a drain, selecting one of the memory cells, and performing an operation on a bit of the selected memory cell, the operation including at least one of programming and erasing, while applying an inhibit word line voltage to a gate of an unselected memory cell.

There is also provided in accordance with a preferred embodiment of the present invention an EEPROM array, the array including a multiplicity of NROM memory cells, wherein each memory cell is connected to a word line and to two bit lines, wherein each NROM cell is individually erasable and individually programmable without significantly disturbing unselected cells. In contrast to the prior art, there is no need for a select transistor for each bit or cell.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 1:
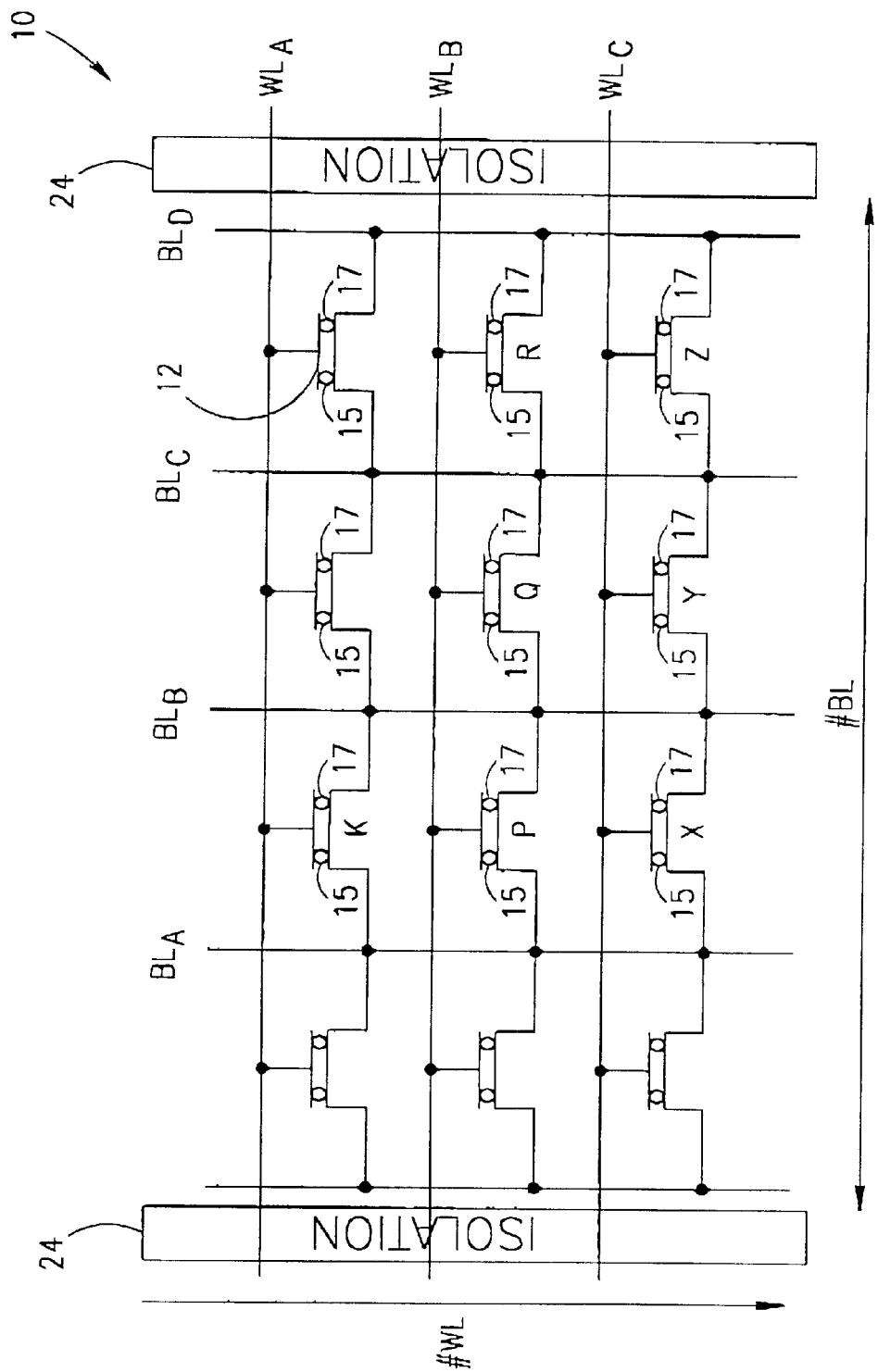
FIG. 1 is a schematic illustration of an EEPROM array of virtual ground NROM memory cells, constructed and operative in accordance with a preferred embodiment of the present invention.

Reference is now made to FIG. 1 which illustrates au EEPROM array 10 constructed and operative in accordance with a preferred embodiment of the present invention. Array 10 comprises a multiplicity of memory cells 12 each connected to an associated word line, generally designated WL, and two bit lines, generally designated BL. For purposes of the following explanation, memory cells 12 are labeled K, P, Q, R, X, Y and Z, respectively. In FIG. 1, memory cells P, Q and R, share the same word line $WL_B$. Cells K, P, X, Q and Y share the same bit line $BL_B$. Cell Z is connected to word line $WL_C$ and bit lines $BL_C$ and $BL_D$.

In accordance with a preferred embodiment of the present invention, memory cells 12 are nitride read only memory (NROM cells. NROM cells are described in various publications, such as U.S. patent applications Ser. Nos. 08/902,890 and 08/905,286, assigned to the common assignee of the present invention, the disclosure of which is incorporated herein by reference. U.S. patent application ser. Nos. 08/902,890 and 08/905,286 describe, inter alia, the steps of programming reading and erasing NROM cells. NROM cells have not heretofore been used in EEPROM arrays. The present invention enables individually accessing NROM cells in such an EEPROM array, and inhibiting program and erase disturbs in the array.

NROM cells may be single bit. Alternatively, they may have more than one bit wherein two individual bits, a left-side bit 15 and a right-side bit 17, are stored in physically different areas of the charge-trapping region. Each bit may be single level or multi-level, i.e., may be programed to different voltage levels.

If it is desired to program right-side bit 17, then the bit line closest to right-side bit 17 (e.g., $BL_B$ for cell P) is the drain and the bit line on the other side (e.g., $BL_A$ for cell P) is the source. When programming right-side bit 17, channel hot electrons are used to inject electrons in a lumped pocket close to the drain side of the cell. The electrons are located in localized states in the nitride layer. In order to program left-side bit 15 of the cell, one simply reverses the role of drain and source during programming.

The discussion follows hereinbelow with reference to a two-bit NROM cell. However, it is readily appreciated by those skilled in the art, that the invention is applicable for single and multi-bit cells as well.

If it is desired to program right-side bit 17 of memory cell P, a gate voltage $V_g$ (typically in the range of approximately 7–10V, e.g., 9V) is applied to word line $WL_B$, a drain voltage $V_d$ (typically in the range of approximately 4–5V, e.g. 4.5V) is applied to bit line $BL_B$, and bit line $BL_A$ is grounded (0V). All other bit lilies are preferably floated near ground prior to any operation (programming or erasing). All other word lines are grounded. The right-side bits 17 of unselected cells K and X, and left-side bit 15 of cell Y share the same bit line $BL_B$ as cell P, and also receive drain voltage $V_d$. Since the gate voltage of cells K, X and Y is zero, these bits experience a lowering of the threshold voltage. In other words, as a consequence of programming right-side bit 17 of cell P, right-side bits 17 of unselected cells K and X, and left-side bit 15 of cell Y undergo partial erasure.

Unselected cell Z does not share the same bit line $BL_B$ or the same word line $WL_B$ as cell P. However, the application of the positive gate voltage to word line $WL_B$ causes some current flow towards the right side of array 10, until the bit lines towards the right of bit line $BL_B$ attain a drain voltage close to $V_d$. (This phenomenon is herein referred to as "high voltage propagation".) The result is that both bits of unselected cell Z receive a zero gate voltage and a positive drain voltage, thereby lowering their threshold voltage. In other words, as a consequence of programming right-side bit 17 of cell P, both the left-side and right-side bits 15 is and 17 of cell Z undergo partial erasure. The same holds true for right-side bit 17 of cell Y, as well as other similarly positioned bits in EEPROM array 10.

Fortunately, however, the duration of programming is typically in the range of approximately 1–10 μsec. Since this programming time is relatively short, the right-side bits 17 of cells K and X, and both bits of cells Y and Z are only slightly erased for each programming operation on right-side bit 17 of cell P. The fact that the gate voltage of cells K, X, Y and Z is only zero and not negative, also minimizes the extent of erasure of these bits.

In order to contain and control the voltage propagation due to the application of the programming voltage, memory cells 12 are preferably placed between a pair of isolation zones 24. The isolation zones 24 define therebetween a slice of word lines and bit lines. There is no voltage propagation past isolation zones 24. Depending on the array design and voltages used, the isolation zones 24 can divide the array into slices of just one column or a plurality of columns.

Unselected cells Q and R share the same word line $WL_B$ as cell P, and also receive the positive gate voltage $V_g$. Therefore, there is virtually no effect on the threshold voltages of both bits of cells Q and R, since tie bit lines on either side of cells Q and R are relatively high.

All the bit lines to the left of bit line $BL_A$ are floated near ground, and thus there is virtually no effect on the threshold voltage of the bits of cells on those bit lines.

Table A summarizes the disturb on unselected cells due to programming right-side bit 17 of cell P:

TABLE A

| Cell | Bit | $V_g$ | $V_d$ | $V_s$ | Effect on $V_t$ |
|---|---|---|---|---|---|
| P | Right | 9 | 4.5 | 0 | Program |
| K | Right | 0 | 4.5 | 0 | Partial Erase |
| Q | Left | 9 | 4.5 | 4.5 | Virtually None |
| Q | Right | 9 | 4.5 | 4.5 | Virtually None |
| R | Both | 9 | 4.5 | 4.5 | Virtually None |
| X | Right | 0 | 4.5 | 0 | Partial Erase |
| Y | Left | 0 | 4.5 | 4.5 | Partial Erase |
| Y | Right | 0 | 4.5 | 4.5 | Partial Erase |
| Z | Both | 0 | 4.5 | 4.5 | Partial Erase |

If it is desired to erase right-side bit 17 of memory cell P, a negative gate voltage $V_g$ (such as approximately in the range of −5 to −7V) is applied to word line $WL_B$, a positive drain voltage $V_d$ (typically in the range of approximately 3–5V, e.g. 4V) is applied to bit line $BL_B$, and bit line $BL_A$ is floating (or driven). Left-side bit 15 of cell Q receives the exact same gate, drain and source voltages. This means that left-side bit 15 of cell Q is also erased together with right-side bit 17 of cell P. Accordingly, after an erasure of right-side bit 17 of cell P, left-side bit 15 of cell Q must be re-programmed to its original value. This is the case for a two-bit NROM cell. For single bit operation, it is preferable to arrange the bits so that they do not share a common bit line. In such an arrangement, no neighboring bit would be erased upon erasure of right-side bit 17 of cell P, for example.

Right-side bit 17 of cell Q and both bits of cell R share the same word line $WL_B$ as cell P, and also receive the negative gate voltage $V_g$. Since there is only a negative gate voltage applied to word line $WL_B$ and the other word lines are grounded, and the bit lines on either side of cells Q and R are floated near ground prior to erasure of right-side bit 17 of cell P, there is no voltage propagation to the other cells and there is negligible erasure of right-side bit 17 of cell Q and both bits of cell R.

The right-side bits 17 of unselected cells K and X, and left-side bit 15 of cell Y share the same bit line $BL_B$ as cell P, and also receive drain voltage $V_d$. Since the gate voltage of cells K, X and Y is zero, right-side bits 17 of unselected cells K and X, and left-side bit 15 of cell Y experience a lowering of the threshold voltage. In other words, as a consequence of erasing cell P, right-side bits 17 of cells K and X, and left-side bit 15 of cell Y undergo partial erasure. Unfortunately, the duration of erasing is typically in the range of approximately 10 µsec–10 msec. After many cycles, the accumulated erasure of the unselected cells may be intolerably significant. Unselected cell Z does not share the same bit line $BL_B$ or the same word line $WL_B$ as cell P, and there is virtually no effect on its threshold voltage. The same holds true for right-side bit 17 of cell Y.

Table B summarizes the disturb effects on unselected cells due to erasing right-side bit 17 of cell P:

TABLE B

| Cell | Bit | $V_g$ | $V_d$ | $V_s$ | Effect on $V_t$ |
|---|---|---|---|---|---|
| P | Right | −7 | 4 | Float | Erase |
| K | Right | 0 | 4 | Float | Partial Erase |
| Q | Left | −7 | 4 | Float | Erase |
| Q | Right | −7 | Float | Float | Virtually None |
| R | Both | −7 | Float | Float | Virtually None |
| X | Right | 0 | 4 | Float | Partial Erase |
| Y | Left | 0 | 4 | Float | Partial Erase |
| Y | Right | 0 | Float | Float | Virtually None |
| Z | Both | 0 | Float | Float | Virtually None |

Figure 2:
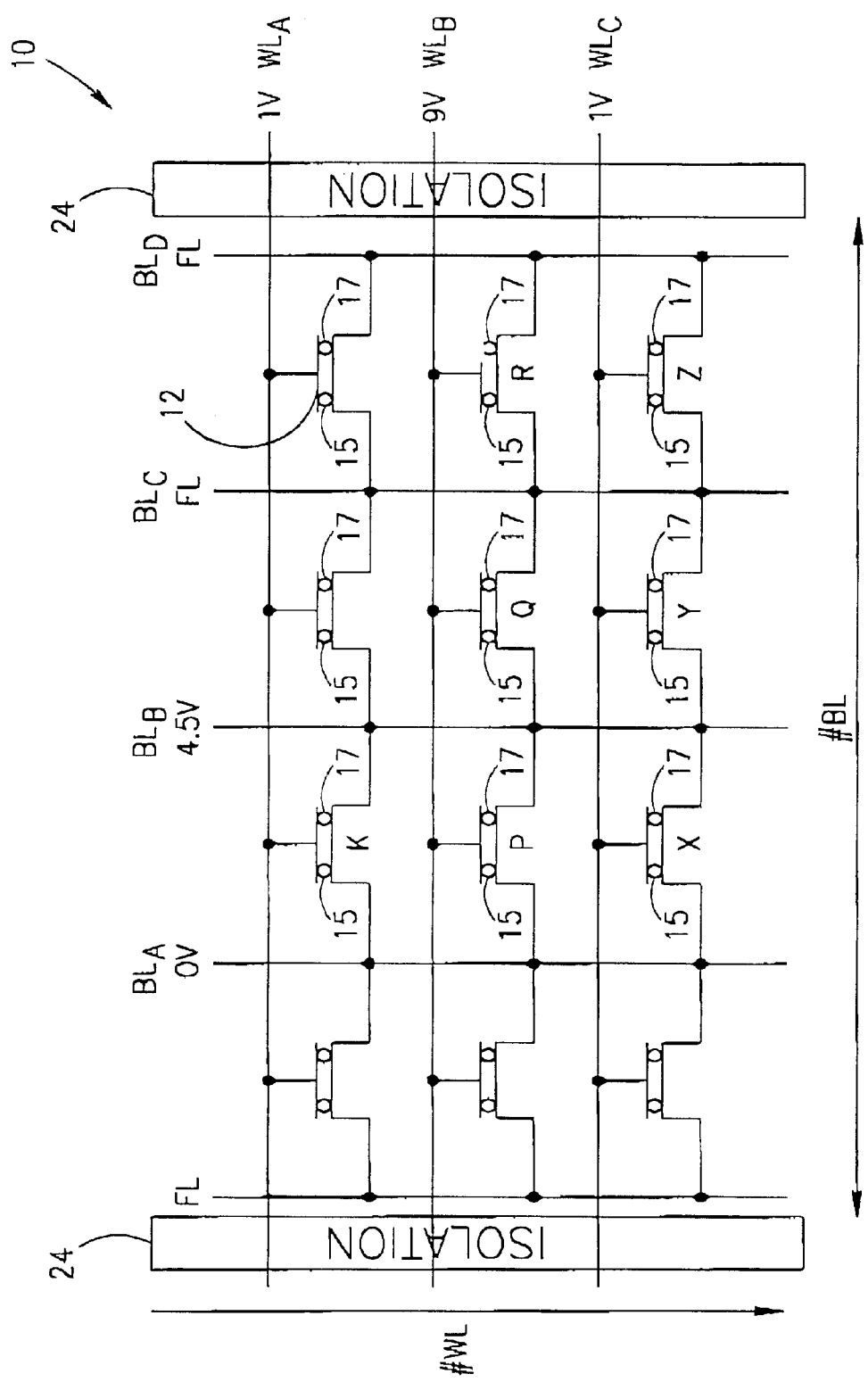
FIGS. 2 and 3 are schematic illustrations of the EEPROM array of FIGS. 1 and 2, showing the application of an inhibit voltage during program and erase operations, respectively, in accordance with a preferred embodiment of the present invention.

In accordance with a preferred embodiment of the present invention) disturb of the unselected cells during programming or erasing of a selected memory cell is inhibited by applying a voltage to the word line of the unselected cell. FIG. 2 illustrates one example of the invention during programming right-side bit 17 of cell P. A gate voltage $V_g$ of 9V is applied to word line $WL_B$, a drain voltage $V_d$ of 4.5V is applied to bit line $BL_B$, and bit line $BL_A$ is grounded (0V). The remaining bit lines are floated near ground before programming.

In order to inhibit lowering of the threshold voltage of right-side bit 17 of cell K, and both bits of cells X and Y, a positive gate voltage is applied to word lines $WL_A$ (of cell K) and $WL_C$ (of cells X and Y). The magnitude of the required inhibit voltage is a function of a number of variables, such as, but not limited to programming time, drain voltage applied to the bit line of the programmed cell, voltage difference between gate and drain voltages applied to the programmed cell, and what is considered a tolerable drop in the threshold voltage of the unselected cell. The tolerable drop in the threshold voltage is further described hereinbelow with reference to FIG. 4. In general, the inhibit voltage should be low enough so as not to program unselected bits, and so as not to cause any significant leakage current, but high enough so that the threshold voltages of unselected memory cells are lowered not more than a predetermined amount (over time or after a predetermined amount of operations). Row and column decoders (not shown) may be used to provide the voltage levels necessary for inhibiting the disturb problem. Such decoders are known in the art and persons skilled in the art may design decoders in accordance with the principles outlined herein.

For the purposes of example only, in the case of $V_g$=9V, $V_d$=4.5V, and a programming time of 4 µsec, it has been found that an inhibit voltage in the range of 0–2.5V, most preferably in the range of 0–1V, is typically sufficient to inhibit the partial erasure of unselected cells K, X and Y such that their threshold voltages are lowered by less than 100 mV per 100,000 accesses (which is considered a tolerable lowering of threshold voltage). These are merely typical exemplary values, and the present invention is not restricted to these values. It is noted that an inhibit voltage of 0–1V is generally sufficiently low so as not to cause any significant leakage current through the cells that receive this gate voltage.

Table C summarizes the effect of the application of the inhibit voltage (e.g., 1V) on the unselected cells when programming right-side bit 17 of cell P:

TABLE C

| Cell | Bit | $V_g$ | $V_d$ | $V_s$ | Effect on $V_t$ |
|---|---|---|---|---|---|
| P | Right | 9 | 4.5 | 0 | Program |
| K | Right | 1 | 4.5 | 0 | Minute Erase |
| Q | Left | 9 | 4.5 | 4.5 | Virtually None |
| Q | Right | 9 | 4.5 | 4.5 | Virtually None |
| R | Both | 9 | 4.5 | 4.5 | Virtually None |
| X | Right | 1 | 4.5 | 0 | Minute Erase |
| Y | Left | 1 | 4.5 | 4.5 | Minute Erase |
| Y | Right | 1 | 4.5 | 4.5 | Minute Erase |
| Z | Both | 1 | 4.5 | 4.5 | Minute Erase |

Figure 3:
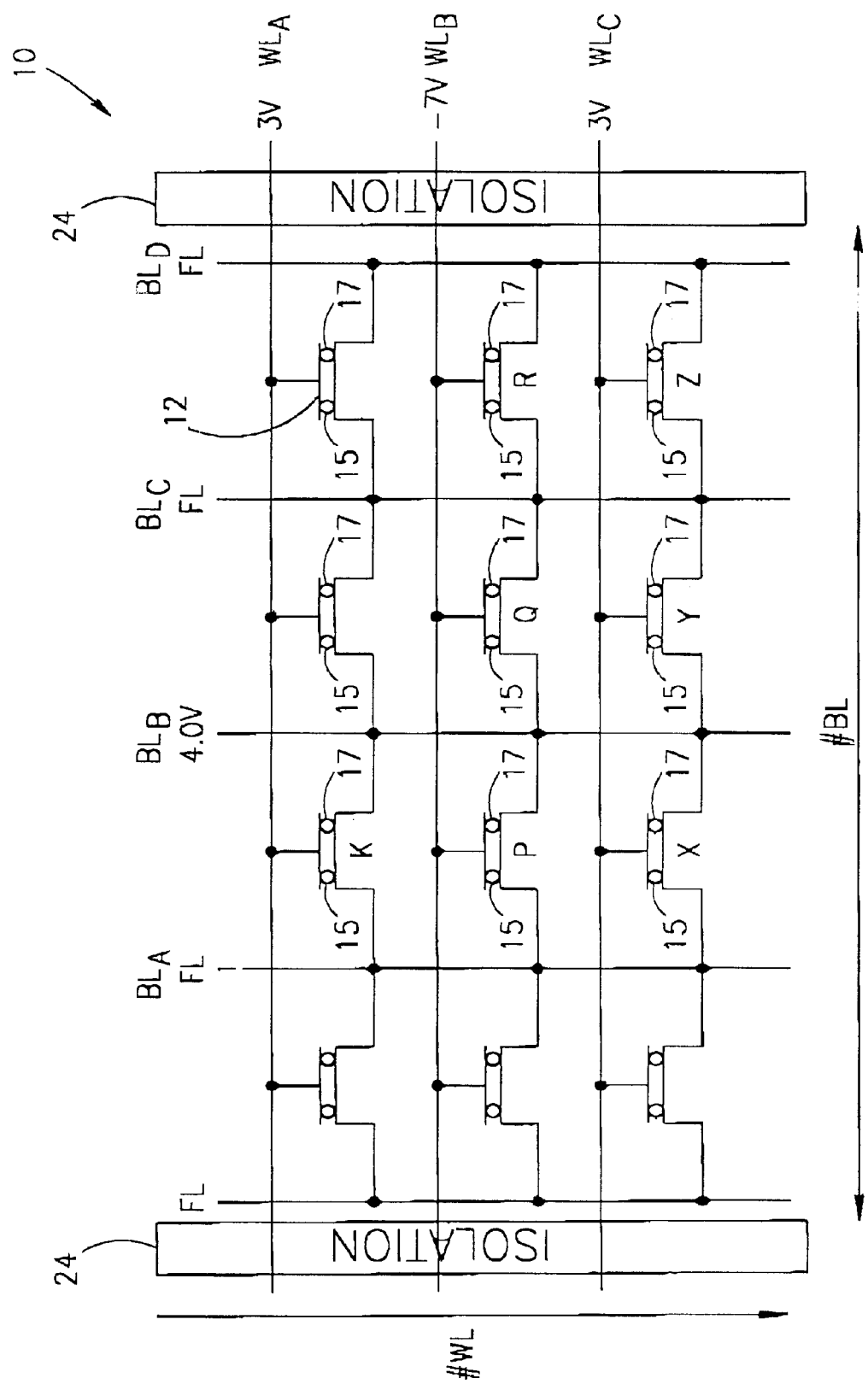

FIG. 3 illustrates one example of the invention during erasing of right-side bit 17 of cell P. As before, a gate voltage $V_g$ of −7V is applied to word line $WL_B$, a drain voltage $V_d$ of 4V is applied to bit line $BL_B$, and the remaining bit lines are floated near ground before erasing.

In order to inhibit lowering of the threshold voltage of right-side bits 17 of cells K and X, and left-side bit 15 of cell Y, a positive gate voltage is applied to word lines $WL_A$ (of cell K) and $WL_C$ (of cells X and Y). For the purposes of example only, in the case of $V_g$=7V, $V_d$=4V, and an erasing time of 2 msec, it has been found that an inhibit voltage in the range of 2.54–5V, most preferably in the range of 3–4V, is typically sufficient to inhibit the partial erasure of right-side bits 17 of unselected cells K and X, and left-side bit 15 of cell Y, such that their threshold voltages are lowered by less than about 100 mV per 100,000 accesses. Again, it is noted that these are merely typical exemplary values, and the present invention is not restricted to these values.

As described hereinabove, if no inhibit voltage were to be applied to the unselected word lines, there would be no voltage propagation to the right-side bit lines of array 10, because the only gate voltage applied would be the negative gate voltage to word line $WL_B$. However, the application of the inhibit voltage of 3V, for example, to the unselected word lines may be of sufficient magnitude so as to slightly turn on the cells to the right and left of bit line $BL_B$ and cause a voltage propagation to all the bit lines of array 10, This means that the bit lines towards the right and left of bit line $BL_B$ receive a positive voltage, the magnitude of which is a function of the inhibit voltage diminished by the threshold voltage, which in turn depends upon the bulk effect of the memory transistors on those unselected bit lines. For example, for an inhibit voltage of 3V and threshold voltage of 1.5V, the bit line voltages may rise to about 1.5V. The result is that for unselected bits on unselected word lines, the combination of the positive inhibit voltage and the positive drain and source voltages causes a disturb, but of generally negligible magnitude. For unselected bits on the selected word line (to which the negative erasure voltage has been applied) the combination of the negative gate voltage and the positive drain and source voltages causes a slight disturb. In the above example, the combination of $V_g$=−7V, $V_d$=1.5V and $V_s$=1.5V, causes a slight erasure but significantly less than the combination of $V_g$=−7V, $V_d$=4V and $V_s$=1.5V on the selected bit which is erased. It is noted that since the memory transistors that propagate the bit line voltage are only slightly turned on, the extent to which the bit line voltage propagates during the erase pulse is limited.

In general, in the present invention the application of the inhibit voltage on the unselected word lines during an erase operation significantly reduces the bit line disturb to the unselected bits, and replaces the relatively high bit line disturb with two other disturbs of a lesser magnitude:

a) a negligible disturb to unselected bits on unselected word lines, and b) a small disturb to unselected bits on the selected word line.

The presence of isolation zones 24 reduces the unwanted voltage propagation, and in doing so, prevents the spread of these two minor disturbs.

Table D summarizes the effect of the application of the inhibit voltage (e.g., 3V) on the unselected cells when erasing right-side bit 17 of cell P:

TABLE D

| Cell | Bit | $V_g$ | $V_d$ | $V_s$ | Effect on $V_t$ |
|---|---|---|---|---|---|
| P | Right | −7 | 4 | 1.5 | Erase |
| K | Right | 3 | 4 | 1.5 | Virtually None |
| Q | Left | −7 | 4 | 1.5 | Erase |
| Q | Right | −7 | 1.5 | 4 | Minute Erase |
| R | Both | −7 | 1.5 | 1.5 | Minute Erase |
| X | Right | 3 | 4 | 1.5 | Virtually None |
| Y | Left | 3 | 4 | 1.5 | Virtually None |
| Y | Right | 3 | 1.5 | 4 | Virtually None |
| Z | Both | 3 | 1.5 | 1.5 | Virtually None |

As mentioned hereinabove, the magnitude of the required inhibit voltage is a function of a number of variables, such as, but not limited to, programming time, drain voltage applied to the bit line of the programmed cell, voltage difference between gate and drain voltages applied to the selected cell, and the tolerable drop in the threshold voltage of the unselected cell.

In the NROM array of the invention, program disturb of unselected bits may also be reduced by using longer programming times and/or lower bit line voltages to complete the programming of the selected bit. Erase disturb of unselected bits may be reduced by using more negative word line voltages and/or shorter erasing times and/or lower bit line voltages to complete the erasing of the selected bit.

Figure 4:
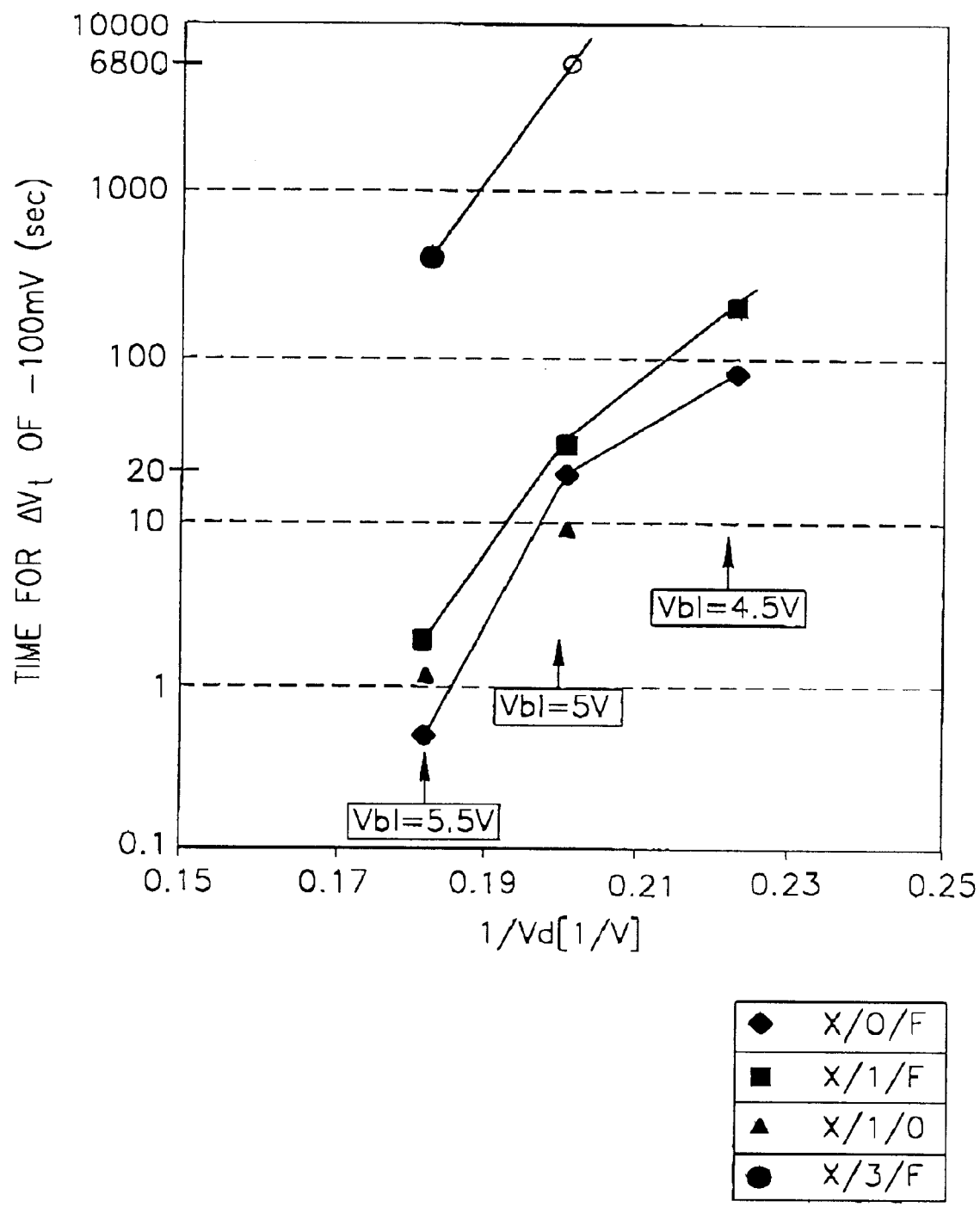
FIG. 4 is a graph illustrating the time required for the threshold voltage to drop by 100 mV as a function of the measured voltage difference between gate and drain voltages applied to the selected cell, for different operating conditions.

Reference is now made to FIG. 4, which graphically illustrates the time required for the threshold voltage to drop by 100 mV as a function of the measured voltage difference between gate and drain voltages applied to the selected cell. The lower curve of FIG. 4 (data marked by diamonds) graphically depicts the time for the threshold voltage to drop by 100 mV for the combination of $V_g$=0V and $V_s$ floating, as a function of different drain voltages. For example, for a combination of $V_d/V_g/V_s$ of 5.5/0/float (as measured in volts), it takes about 0.5 sec for the threshold voltage to drop by 100 mV. For a combination of $V_d/V_gV_s$ of 5/0/float, it takes about 20 sec for the threshold voltage to drop by 100 mV. For a combination of $V_d/V_g/V_s$ of 4.5/0/float, it takes about 85 sec for the threshold voltage to drop by 100 mV. Thus, the time for erase disturbs to affect unselected cells is not very prolonged.

In contrast, as depicted in the upper curve of FIG. 4 (data marked by circles), for a combination of $V_d/V_g/V_s$ of 5.5/3/float, i.e., upon application of a 3V inhibit gate voltage, it takes about 4600 sec for the threshold voltage to drop by 100 mV. For a combination of $V_d/V_g/V_s$ of 5/3/float, it takes about 6800 sec for the threshold voltage to drop by 100 mV. Thus, when an inhibit voltage is applied to unselected cells, the time for erase disturbs to affect the unselected cells is greatly increased. There is no appreciable lowering of the threshold voltage of the unselected cells even after a long time.

The accumulated disturb, i.e., change in threshold voltage, over many access operations, and with the application of the inhibit voltage, may be calculated for the unselected bits as follows, for all operations of erase or program:

$\Delta V_{t\ total}$ (the total change in the threshold voltage of a bit due to disturbs)=$\Delta V_{t1}$ (due to erase and program operations on the other bits residing on the same bit line)+ $\Delta V_{t2}$ (due to erase and program operations on the other bits residing on other bit lines and other word Lines)+ $\Delta V_{t3}$ (due to erase and program operations on the other bits residing on other bit lines and on the same word line).

The following is an illustrative example based upon Tables C and D hereinabove. The total change in the threshold voltage of the left-side bit 15 of cell Y, $\Delta V_{t\ total}$ (assuming that this bit has been previously programmed), would be the sum of:

$\Delta V_{t1}$ caused by the application of a combination of $V_d/V_g/V_s$=4.5/1/4.5 (volts) while programming any or all of the other bits on bit line $BL_B$, and $V_d/V_g/V_s$=4/3/1.5 while erasing any or all of the other bits on bit line $BL_B$, plus $\Delta V_{t2}$ caused by the application of a combination of $V_d/V_g/V_s$=4.5/1/4.5 while programming any or all of the other bits on bit lines other than $BL_B$ and on word lines other than $WL_C$, and $V_d/V_g/V_s$=1.5/3/1.5 while erasing any or all of the other bits on bit lines other than $BL_B$ and on word lines other than $WL_C$, plus $\Delta V_{t3}$ caused by the application of a combination of $V_d/V_g/V_s$=4.5/9/4.5 while programming any or all of the other bits on bit lines other than $BL_B$ and on word line $WL_C$, and $V_d/V_g/V_s$=1.5/−7/1.5 while erasing any or all of the other bits on bit lines other than $BL_B$ and on word line $WL_C$.

The accumulated disturb times are calculated as follows:

For bits on the selected bit line and unselected word lines, corresponding to $\Delta V_{t1}$, the accumulated disturb time is:

$$\tau_{disturb} = \tau_{operation} N_{WL} \phi$$

wherein $\tau_{disturb}$ is the accumulated disturb time, $\tau_{operation}$ is the average time duration of performing operation (erase or program), $N_{WL}$ is the number of word lines in the array and $\phi$ is the number of times cell is accessed.

For bits on unselected bit lines and unselected word lines, corresponding to $\Delta V_{t2}$, the accumulated disturb time is:

$$\tau_{disturb} = \tau_{operation} N_{WL} N_{BL} \phi$$

wherein $N_{BL}$ is the number of bit lines in the array.

For bits on unselected bit lines and on the selected word line, corresponding to $\Delta V_{t3}$, the accumulated disturb time is:

$$\tau_{disturb} = \tau_{operation} N_{BL} \phi$$

It will be appreciated by persons skilled in the art that the present invention is not limited by what has been particularly shown and described herein above. Rather the scope of the invention is defined by the claims that follow.

What is claimed is:

1. A method for operating an electrically erasable programmable read only memory (EEPROM) array, the method comprising:
   providing an array comprising a multiplicity of nitride read only memory (NROM) cells, wherein each memory cell is connected to a word line and to two bit lines;
   selecting one of said memory cells; and
   erasing a bit of the selected memory cell, while applying an inhibit word line voltage to a gate of an unselected memory cell.

2. The method according to claim 1 wherein said memory cells comprise non-floating gate memory cells.

3. The method according to claim 1 wherein said memory cells are nitride read only memory (NROM) cells.

4. The method according to claim 3 wherein said NROM cells comprise a single bit per cell.

5. The method according to claim 3 wherein said NROM cells comprise more than one bit per cell.

6. The method according to claim 1 wherein said array comprises a virtual ground array.

7. The method according to claim 1 wherein said unselected memory cell shares the same bit line as said selected cell.

8. The method according to claim 1 wherein said unselected memory cell does not share the same bit line as said selected cell.

9. The method according to claim 1 wherein said inhibit gate voltage is of such magnitude that a threshold voltage of said unselected memory cell is lowered not more than a predetermined amount.

10. The method according to claim 1 wherein one of said bit lines serves as a drain and another of said bit lines serves as a source, and wherein said erasing of said bit comprises applying to said selected memory cell a negative word line voltage and a positive voltage to the bit line where said bit is located.

11. The method according to claim 10 wherein said bit of the selected memory cell shares a common bit line with another bit which is unselected, and wherein erasing said bit of the selected memory cell also causes erasing of said other bit on the common bit line.

12. The method according to claim 1 and further comprising having at least one column of said memory cells located between a pair of isolation zones.

13. A method for operating an EEPROM array, the method comprising:
   providing an array comprising a multiplicity of nitride read only memory (NROM) cells, wherein each memory cell is connected to a word line and to two bit lines;
   selecting one of said memory cells; and
   performing an operation on a bit of the selected memory cell, said operation comprising at least one of programming and erasing, while applying an inhibit word line voltage to a gate of an unselected memory cell.

14. The method according to claim 13 wherein said array comprises a virtual ground array.

15. The method according to claim 13 wherein said NROM cells comprise a single bit per cell.

16. The method according to claim 13 wherein said NROM cells comprise more than one bit per cell.

17. The method according to claim 13 wherein said unselected memory cell shares the same bit line as said selected cell.

18. The method according to claim 13 wherein said unselected memory cell does not share the same bit line as said selected cell.

19. The method according to claim 13 wherein said inhibit gate voltage is of such magnitude that a threshold voltage of said unselected memory cell is lowered not more than a predetermined amount.

20. The method according to claim 13 wherein one of said bit lines serves as a drain and another of said bit lines serves as a source, and wherein said programming comprises applying to said selected memory cell a positive gate voltage, a positive drain voltage and a ground source voltage.

21. The method according to claim 13 wherein one of said bit lines serves as a drain and another of said bit lines serves as a source, and wherein said erasing comprises applying to said selected memory cell a negative word line voltage and a positive voltage to the bit line where said bit is located.

22. The method according to claim 21 wherein said bit of the selected memory cell shares a common bit line with another bit which is unselected, and wherein erasing said bit of the selected memory cell also causes erasing of said other bit on the common bit line.

23. The method according to claim 13 and further comprising placing at least one column of said memory cells between a par of isolation zones.

* * * * *